(12) United States Patent
Xin et al.

(10) Patent No.: US 8,759,811 B2
(45) Date of Patent: Jun. 24, 2014

(54) PARTICLE ENCAPSULATED NANOSWITCH

(75) Inventors: Hao Xin, Tucson, AZ (US); Jon Leonard, Tucson, AZ (US); Qing Jiang, Riverside, CA (US); Javier Garay, Riverside, CA (US); Cengiz Ozkan, San Diego, CA (US)

(73) Assignee: Raytheon Company, Waltham, MA (US)

( * ) Notice: Subject to any disclaimer, the term of this patent is extended or adjusted under 35 U.S.C. 154(b) by 2740 days.

(21) Appl. No.: 11/353,541

(22) Filed: Feb. 14, 2006

(65) Prior Publication Data
US 2007/0192911 A1 Aug. 16, 2007

(51) Int. Cl.
*D01F 9/12* (2006.01)

(52) U.S. Cl.
USPC ......... 257/9; 257/E51.003; 977/742; 977/744

(58) Field of Classification Search
USPC .................. 257/9, E51.003; 977/744, 742
See application file for complete search history.

(56) References Cited

U.S. PATENT DOCUMENTS

| | | | | |
|---|---|---|---|---|
| 3,710,050 A | * | 1/1973 | Richards | 200/61.43 |
| 6,251,522 B1 | * | 6/2001 | Tanaka et al. | 428/408 |
| 6,399,221 B1 | * | 6/2002 | Marks et al. | 428/690 |
| 6,636,433 B2 | * | 10/2003 | Tanikawa | 365/36 |
| 6,756,795 B2 | | 6/2004 | Hunt et al. | |
| 6,986,876 B2 | * | 1/2006 | Smalley et al. | 423/447.1 |
| 7,087,920 B1 | * | 8/2006 | Kamins | 257/2 |
| 7,382,648 B2 | * | 6/2008 | Bockrath | 365/164 |
| 2002/0084410 A1 | * | 7/2002 | Colbert et al. | 250/306 |
| 2002/0163079 A1 | * | 11/2002 | Awano | 257/750 |
| 2002/0179898 A1 | * | 12/2002 | Marks et al. | 257/40 |
| 2003/0039604 A1 | * | 2/2003 | Niu et al. | 423/447.1 |
| 2003/0129122 A1 | * | 7/2003 | Chen et al. | 423/447.3 |
| 2003/0178617 A1 | * | 9/2003 | Appenzeller et al. | 257/20 |
| 2005/0095938 A1 | * | 5/2005 | Rosenberger et al. | 442/194 |
| 2005/0117441 A1 | | 6/2005 | Lieber et al. | |
| 2006/0115640 A1 | * | 6/2006 | Yodh et al. | 428/221 |
| 2006/0205105 A1 | * | 9/2006 | Maruyama et al. | 438/50 |
| 2006/0239907 A1 | * | 10/2006 | Luzzi et al. | 424/1.11 |
| 2008/0212361 A1 | * | 9/2008 | Bertin et al. | 365/151 |
| 2010/0066550 A1 | * | 3/2010 | Mottram | 340/644 |

FOREIGN PATENT DOCUMENTS

WO 03052182 A1 6/2003

OTHER PUBLICATIONS

Balasubramanian et al., Chemically Functionalized Carbon Nanotubes, Small 2005, 1(2):180*-092, Published Online: Dec. 28, 2004.
Guo et al., Nanotubes with Conducting Molecules Covalently Bridging Gaps in Single-Walled Carbon, Science Jan. 20, 2006, 311(5759): 356-359.
European Patent Office "Supplementary European Search Report," mailed Jun. 3, 2009, for European Application No. 07 75 6969.

(Continued)

*Primary Examiner* — Hrayr A Sayadian
(74) *Attorney, Agent, or Firm* — Cantor Colburn LLP

(57) ABSTRACT

The disclosed system, device and method for molecular-scale electronic switching generally includes a carbon nanotube, an anode, a cathode and two conductive particles encapsulated within the carbon nanotube, wherein the particles are configured to move between high resistance and low resistance states. Disclosed features and specifications may be variously controlled, adapted or otherwise optionally modified to realize improved switching function.

16 Claims, 2 Drawing Sheets

(56) References Cited

OTHER PUBLICATIONS

Dai H. et al. "Controlled Chemical Routes to Nanotube Architectures, Physics and Devices," Journal of Physical Chemistry, B, Materials, Surfaces, Interfaces and Biophysical, Washington, D.C., US, vol. 103, No. 51, Dec. 7, 1999, pp. 11246-11255, XP002963355, ISSN: 1089-5647.
European Patent Office "Office Action" mailed Mar. 11, 2010; Application No. 07 756 969.7-2109, filed Sep. 10, 2008.

* cited by examiner

PARTICLE ENCAPSULATED NANOSWITCH

FIELD OF INVENTION

The present invention generally provides a system, device and method for electronic switching; and more particularly, representative and exemplary embodiments of the present invention generally relate to molecular-scale electronic switches and logic circuits.

BACKGROUND OF INVENTION

Current digital processors are fabricated on a scale of between 90 and 130 nm, with 65 nm chips anticipated by Q4 of 2005. Just a decade ago, digital processors were built on a scale of about 500 nm. While this reduction in feature size is expected to continue, at least in the near term, conventional means for producing semiconductor chips will eventually be limited by various physical constraints. These constraints include inter alia: the scale of minimal semiconductor features; the inability of conventional photolithographic processes to produce transistors at smaller than macromolecular scales; and the potential cost of materials for production of smaller and smaller transistors. Accordingly, what is needed are methods for fabricating and operating digital electronic switches that are not substantially sensitive to the constraints that typically limit the conventional art.

SUMMARY OF THE INVENTION

In various representative aspects, the present invention provides a device and method for molecular-scale switching employing a carbon nanotube (CNT) with encapsulated particles. Advantages of the present invention will be set forth in the Detailed Description which follows and may be apparent from the Detailed Description or may be learned by practice of exemplary embodiments of the invention. Still other advantages of the invention may be realized by means of any of the instrumentalities, methods or combinations particularly pointed out in the claims.

BRIEF DESCRIPTION OF THE DRAWINGS

Representative elements, operational features, applications and/or advantages of the present invention reside inter alia in the details of construction and operation as more fully hereafter depicted, described and claimed—reference being made to the accompanying drawings forming a part hereof, wherein like numerals refer to like parts throughout. Other elements, operational features, applications and/or advantages will become apparent in light of certain exemplary embodiments recited in the Detailed Description, wherein:

Figure 1:
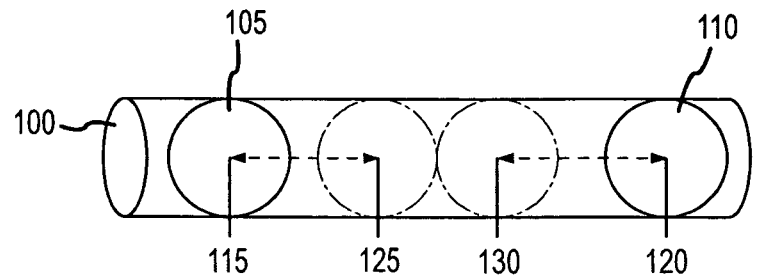
FIG. 1 representatively illustrates a nanotube device with a pair of at least partially conductive particles disposed therein, wherein the one-dimensional degree of freedom associated with motion of the encapsulated particles within the nanotube is generally depicted in accordance with an exemplary embodiment of the present invention.

Elements in the Figures are illustrated for simplicity and clarity and have not necessarily been drawn to scale. For example, the dimensions of some of the elements in the Figures may be exaggerated relative to other elements to help improve understanding of various embodiments of the present invention. Furthermore, the terms "first", "second", and the like herein, if any, are used inter alia for distinguishing between similar elements and not necessarily for describing a sequential or chronological order. Moreover, the terms "front", "back", "top", "bottom", "over", "under", and the like in the Description and/or in the claims, if any, are generally employed for descriptive purposes and not necessarily for comprehensively describing exclusive relative position. Any of the preceding terms so used may be interchanged under appropriate circumstances such that various embodiments of the invention described herein may be capable of operation in other configurations and/or orientations than those explicitly illustrated or otherwise described.

DETAILED DESCRIPTION OF EXEMPLARY EMBODIMENTS

The following representative descriptions of the present invention generally relate to exemplary embodiments and the inventors' conception of the best mode, and are not intended to limit the scope, applicability or configuration of the invention in any way. Rather, the following description is intended to provide convenient illustrations for implementing various embodiments of the invention. As will become apparent, changes may be made in the function and/or arrangement of any of the elements described in the disclosed exemplary embodiments without departing from the spirit and scope of the invention.

Various representative implementations of the present invention may be applied to any system employing particle encapsulated nanotubes, as well as the use of such devices in electronic switching applications. Certain representative implementations may include, for example, a carbon nanotube (encapsulated with electrically-charged particles, endo-fullerenes, for instance, or magnetized particles, e.g., iron, cobalt and nickel clusters) coupled to a voltage source. Such representative implementations are provided as a specific enabling disclosure that may be generalized to any application of the disclosed system, device and method for molecular-scale electronic switching in accordance with various embodiments of the present invention.

As used herein, the term "nanotube" (including any variation or combination thereof is generally intended to include any supra-molecular configuration with dimensions on the order of $10^{-9}$ meters, such as, for example: a carbon nanotube (CNT); a carbon nanofunnel; a carbon nanodisc; and/or the like.

As used herein, the term "tube wall" (including any variational or combinatorial equivalent thereof is generally intended to include any surface feature generally defined by the topology of a nanotube, such as, for example: an outer surface of a substantially cylindrical geometry formed by a nanotube; the inner surface of a substantially cylindrical geometry formed by a nanotube; and/or the like.

As used herein, the term "particle" (including any variational or combinatorial equivalent thereof is generally intended to include anything that is capable of being disposed within a nanotube, such as, for example: a fullerene, such as C60, a metallic and/or ferromagnetic atom or a cluster of such atoms, including cobalt, iron and nickel, and/or the like.

As used herein, the terms "encapsulated" and "disposed" (including any variational or combinatorial equivalents thereof are generally intended to substantially reference the location of a first particle (e.g., the square of the probability function, generally corresponding to the spatial location of the first particle) as being, for example: interiorly localized within a second body; in effective contact with a second particle; out of effective contact with a second particle; exteriorly localized outside a second body, and/or the like.

As used herein, the term "actuate" (including any variational or combinatorial equivalent thereof) is generally intended to reference the application of any type of impetus that is suitably adapted to induce movement (and/or spin) of at least one particle from at least a first position (and/or spin state) to a second position (and/or spin state), by application of, for example: a voltage, a current, a magnetic field, and/or the like.

As used herein, the term "coupled" (including any variational or combinatorial equivalent thereof) is generally intended to reference the ability of a particle's spatial location (and/or spin state) to be modified by actuation of the spatial location (and/or spin state) of a second body, such as, for example, via electronic conduction, magnetic induction, and/or the like.

As used herein, the term "oscillation" (including any variational or combinatorial equivalent thereof) is generally intended to reference time-rated periodic variation of a particle's spatial location (and/or spin state) from a first position (and/or spin state) to a second position (and/or spin state), thereafter returning to the first position (and/or spin state), and/or the like.

As used herein, the term "nanoswitch" (including any variational or combinatorial equivalent thereof) is generally intended to include any switch whose size is on the order of about $10^{-9}$ meters.

As used herein, the term "logic circuit" (including any variational or combinatorial equivalent thereof) is generally intended to include anything that makes use of a functional two-bit circuit or an arrangement of functional two-bit circuits to perform a programmed function, such as, for example: an AND gate; an OR gate; and/or the like.

As used herein, the term "tunneling" (including any variational or combinatorial equivalent thereof) is generally intended to reference the phenomenon of quantum tunneling (i.e., the quantum-mechanical effect of transitioning through a generally classically-forbidden energy state).

If one considers rolling a ball up an incline, if the ball is not given enough push (i.e., kinetic energy), then the ball will not make it to the other side of the hill. In the case of quantum tunneling, however, this is not necessarily the case.

At a quantum mechanical scale, particles do not have the physical characteristics of classical objects. Rather, at the quantum mechanical scale, particle positions are best described by probability wavefunctions that may only be localized to a discrete position via measurement of or interaction with the immediate environment. The implication is that in the quantum scale scenario of a particle moving up (or against) a hill (i.e., potential energy barrier), some of the wavefunction density may actually penetrate and extend all the way through to the other side of the barrier. Having some of the wavefunction on the other side of the hill means that the particle has a non-zero probability of being localized on the other side of the barrier without having had to exist in any of the locations (or energy states) in between. This type of transition has no analogy to classical motion, and is generally referred to as "tunneling" (as if to suggest that the particle were 'digging' through the potential barrier).

The motion of an electron in a potential barrier V(x) may be given by the time-independent Schrödinger equation as:

$$\left(\frac{-\hbar^2}{2m}\frac{d^2}{dx^2} + V(x)\right)\Psi(x) = E\Psi(x)$$

where m is the mass of the particle, $\Psi(x)$ is the particle's wavefunction, and E is the particle's energy.

Recasting the wavefunction $\Psi(x)$ as an exponential function:

$$\Psi(x) = e^{\Phi(x)}$$

we obtain the following operator expression for the Schrödinger equation:

$$\Phi''(x) + \Phi'(x)^2 = \frac{2m}{\hbar^2}(V(x) - E)$$

Separating $\Phi'(x)$ into real and imaginary parts, we obtain:

$$\Phi'(x) = A(x) + iB(x)$$

which, when substituted into the Schrödinger equation, yields:

$$A'(x) + A(x)^2 - B(x)^2 = \frac{2m}{\hbar^2}(V(x) - E)$$

where $B'(x) - 2A(x)B(x) = 0$.

If we expand each function as a power series of h, the following may be obtained as a semi-classical approximate solution:

$$A(x) = \frac{1}{\hbar}\sum_{i=0}^{\infty}\hbar^i A_i(x)$$

$$B(x) = \frac{1}{\hbar}\sum_{i=0}^{\infty}\hbar^i B_i(x)$$

The physical constraints on the lowest order terms are as follows:

$$A_0(x)^2 - B_0(x)^2 = 2m(V(x) - E)$$

$$A_0(x)B_0(x) = 0$$

If we assume that the amplitude varies slowly as compared to the phase, we can set $A_0(x) = 0$ and obtain:

$$B_0(x) = \pm\sqrt{2m(E - V(x))}$$

which is only valid when we have more kinetic energy E than potential energy V(x) (i.e., "classical motion").

Following the same procedure to the next order of expansion, we obtain the following approximate expression for the wavefunction:

$$\Psi(x) = C\frac{e^{2\int dx\sqrt{\frac{2m}{\hbar^2}(E-V(x))} + \theta}}{\sqrt[4]{\frac{2m}{\hbar^2}(E - V(x))}}$$

If we now assume that the phase varies slowly as compared to the amplitude, we can set $B_0(x)$ and obtain:

$$A_0(x) = \pm\sqrt{2m(V(x) - E)}$$

which is only valid when we have more potential energy V(x) than kinetic energy E (i.e., "tunneling motion").

The next order of the expansion yields the following approximate expression for the wavefunction:

$$\Psi(x) = \frac{C_+ e^{+\int dx \sqrt{\frac{2m}{\hbar^2}(V(x)-E)}} + C_- e^{-\int dx \sqrt{\frac{2m}{\hbar^2}(V(x)-E)}}}{\sqrt[4]{\frac{2m}{\hbar^2}(V(x)-E)}}$$

It is apparent from the denominator that both of these approximate solutions are not well-behaved near the classical turning point E=V(x) (i.e., where the kinetic energy and potential energy are equivalent). Away from the potential energy barrier, the particle acts similarly to a free wave (i.e., the phase is oscillating). Beneath the potential energy barrier, the particle undergoes exponential changes in amplitude.

In a specific tunneling problem, the transition amplitude is generally proportional to:

$$e^{-\int dx \sqrt{\frac{2m}{\hbar^2}(V(x)-E)}}$$

and thus, the tunneling is exponentially dampened by large deviations from otherwise classically permitted motion.

To be complete, we must characterize the approximate solutions everywhere and match coefficients to derive a global solution. Approximating the solution near the classical turning point E=V(x), we can expand $$\frac{2m}{\hbar^2}(V(x)-E)$$

in a power series:

$$\frac{2m}{\hbar^2}(V(x)-E) = U_1(x-x_1) + U_2(x-x_1)^2 + \dots$$

Approximating to the linear order of $$\frac{2m}{\hbar^2}(V(x)-E) = U_1(x-x_1),$$

we obtain:

$$\frac{d^2}{dx^2}\Psi(x) = U_1(x-x_1)\Psi(x).$$

Transforming this differential equation into a Bessel function yields:

$$\Psi(x) = \sqrt{x-x_1}\left(C_{+\frac{1}{3}}J_{+\frac{1}{3}}\left[\frac{2}{3}\sqrt{U_1}(x-x_1)^{\frac{1}{3}}\right] + C_{-\frac{1}{3}}J_{-\frac{1}{3}}\left[\frac{2}{3}\sqrt{U_1}(x-x_1)^{\frac{1}{3}}\right]\right)$$

Given the two coefficients on the one side of the classical turning point, we are able to determine the two coefficients on the other side by using this local solution to connect them.

The Bessel functions will asymptotically drive to sine, cosine and exponential functions in the proper limits. The relationship is as follows:

$$C_+ = \frac{1}{2}C\cos\left(\theta - \frac{\pi}{4}\right)$$

$$C_- = -C\sin\left(\theta - \frac{\pi}{4}\right)$$

Accordingly, the transmission coefficient $$T = \left|\frac{C_{out}}{C_{in}}\right|^2$$

for a particle tunneling through a one-dimensional potential energy barrier is found to be:

$$T = \frac{e^{-2\int_{x_1}^{x_2} dx \sqrt{\frac{2m}{\hbar^2}(V(x)-E)}}}{\left(1 + \frac{1}{4}e^{-2\int_{x_1}^{x_2} dx \sqrt{\frac{2m}{\hbar^2}(V(x)-E)}}\right)^2}$$

where $x_1$ and $x_2$ are the classical turning points for the potential barrier. If we take the classical limit of all other physical parameters as being much larger than Planck's constant (i.e., h→0), we see that the transmission coefficient T correctly goes to zero. On physical scales that are on the order of Planck's constant, however, the tunneling effect becomes more pronounced.

A detailed description of an exemplary application, namely a nano-scale device that is suitably configured to switch an electric current on and off at high speed, is provided as a specific enabling disclosure that may be generalized to any application of the disclosed system, device and method in accordance with various embodiments of the present invention.

Nano-scale devices that are adapted to switch electronic current on and off at high speed will be fundamental building blocks to realize functional nano-electronic circuits. Various molecular-level switches have been investigated, with nano-mechanical switches presenting attractive features. The present invention describes a new carbon nanotube based supra-molecular configuration that may be switched as fast as about 100 GHz or more. Such devices may be manufactured using self-assembly techniques. The devices may be easily actuated by applying a small electric voltage or current through anode and cathode contacts, or by wireless means.

At the device level, various types of molecular electronics have been conventionally investigated, including: tunneling junctions, negative differential resistance, and electro-mechanical switches. However, there are several difficult challenges to be addressed before realizing practical nano-mechanical memory and logic devices, including switching speed, manufacturability, and actuation mechanisms. In fact, micro- or nano-scale electromechanical devices faster than 1 GHz have yet to be demonstrated in the conventional art.

The present invention generally involves an innovative carbon nanotube based fast switch device utilizing the unique electronic transport properties of, for example, single-walled carbon nanotubes and an efficient self-assembly process for embedding magnetic particles inside the nanotubes.

Carbon nanotubes (CNT's) are essentially self-assembling nano-structures, which may be regarded as comprising sheets of hexagonally-arranged carbon atoms rolled into cylinders with a diameter on the order of $10^{-9}$ meters. A tube comprising one or more sheets is called a single-walled or multi-walled CNT (SWNT or MWNT), respectively. A SWNT may be metallic or semi-conducting depending on its geometry and local interactions with other atoms or molecules, which may be characterized by how the sheet is rolled to make the SWNT.

The presence of two nano-particles encapsulated in a SWNT will generally cause a change in the local electronic structure (e.g., band gap) of a semi-conducting nanotube which varies with the separation distance of the nano-particles disposed therein. The local electronic structure may be adjusted by varying the separation distance and, more specifically, the conduction threshold voltage may be reduced or increased by changing the separation distance. Setting a biasing voltage across the nanotube section demarked by two nano-particles where the voltage is lower than the conducting threshold at a given separation distance results in an OFF state for the nano-scale switch. Setting a bias where the voltage meets or is higher than the conducting threshold at a given separation distance results in an ON state for the switch. Varying the separation distance can turn the OFF state to the ON state and vice versa. The nano-particles can oscillate at frequencies as high as several hundreds of GHz, leading to a fast electro-mechanical nano-scale switch.

To illustrate the working principle, consider the C60/CNT system as the model system, in which the encapsulated particles are the C60 molecules. Note that the encapsulated particles in the disclosed devices are not restricted to the C60 molecules. The C60 molecule has a five-fold degenerate highest occupied $h_u$ orbital, which is separated by a gap of approximately 2 eV from a three-fold degenerate unoccupied $t_{1u}$ orbital. The one-dimensional states of a semiconducting CNT form a series of occupied and unoccupied energy sub-bands indexed by the azimuthal quantum number m. These sub-bands are arranged symmetrically in energy about the chemical potential, with the m=0; ±1 sub-bands with a few volts of the chemical potential—near the expected energy range of the C60 molecule's occupied $h_u$ orbital and unoccupied $t_{1u}$ orbital. The hybridization of CNT states and the C60 orbitals leads to the difference in the electron transport properties between the C60-CNT peapods and the pure CNTs; and more specifically, it enhances tunneling of electrons.

Qualitatively speaking, placing C60 molecules inside a CNT as a close-packed one-dimensional array leads to the dispersion of the C60-derived band that arises from: (1) direct overlap between orbitals on nearest neighboring C60 molecules; and (2) an indirect process in which electrons tunnel from a C60 molecule onto the CNT and then onto a neighboring C60 molecule. In a representative and exemplary configuration of this supra-molecular structure, the indirect tunneling between two neighboring C60 molecules is more dominating than the direct overlap between the orbitals. In such a configuration, the CNT operates as a conduit that enhances the coupling between the C60 molecules. Furthermore, the electronic state interaction is constrained by the high symmetries of the electronic states of both the C60 molecules and the CNT. The hybridization of CNT states and the C60 orbitals for the states with the same azimuthal symmetry is the strongest, and it is dominated by that of the CNT's m=+1 sub-band interacting with the C60's unoccupied $t_{1u}$ orbital.

For a quantitative calculation of the electronic structure of a C60-CNT peapod, one may approximate the model Hamiltonian with three terms, in which the first term describes the unperturbed electronic states of the CNT's m=+1 sub-band, the second models the orbital energy of the unoccupied $t_{1u}$ orbitals of the C60 arrays, and the last term captures the tunneling between these states.

Encapsulating an array of many nano-particles inside a semi-conducting nanotube would lead to a one-dimensional array of such transistors. Two- and three-dimensional arrangements of such structures would lead to two- and three-dimensional arrangements of such switches. Such supra-molecular switching configurations may enable future nano-electronic circuits such as memory and logic devices. The disclosed carbon nanotube devices so configured, may be integrated into existing or future advanced semiconductor processes.

As generally depicted in FIG. 1, a representative embodiment of the present invention provides a single-walled carbon nanotube 100 encapsulated with particles 105/110. More specifically, elements 105 and 110 generally represent the electron probability distributions for the encapsulated particles. The arrows indicate the one-dimensional degree of freedom for the encapsulated particles between starting positions 115/120 and ending positions 125/130, respectively. Starting positions 115/120 and ending positions 125/130 respectively correspond to configurations under energy conditions sufficient to induce tunneling oscillations of the encapsulated particles' electron probability distributions 105/110. Tunneling behavior is brought about because the presence of encapsulated particles 105/110 causes a change in the local electronic environment (e.g., the band gap of nanotube 100). This change generally varies with the separation distance of particles 105/110. The local electronic environment may be adjusted by varying the separation distance, and more specifically, the threshold conduction voltage. For example, the voltage may be reduced or increased by changing the separation distance of particles 105/110. The particle separation distance is generally on the order of about 1 nm.

The system may experience both symmetric oscillations (e.g., oscillations wherein the encapsulated particles 105/110 move in opposite directions with respect to a point between the particles) and non-symmetric oscillations (e.g., oscillations wherein the encapsulated particles 105/110 move in the same direction with respect to a point between the particles 105/110). Symmetric oscillations generally occur at frequencies up to about 520 GHz, while non-symmetric oscillations generally occur at frequencies of up to about 110 GHz.

In addition to high frequency oscillations, since the movement of the particles is by tunneling rather than translation through medial positions between the starting 115/120 and ending positions 125/130, the oscillations generate almost no heat. The low level of heat generation results in very little energy loss arising from oscillation of the encapsulated particles.

Figure 2:
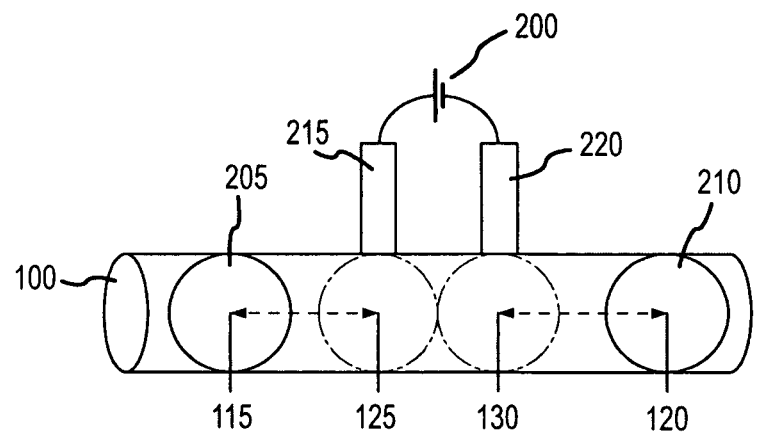
FIG. 2 representatively illustrates a nanotube switch with the particles' electron probability density distributions in an 'OFF' configuration in accordance with an exemplary embodiment of the present invention.

As generally depicted in FIG. 2, a representative embodiment of the present invention provides a nanoswitch comprising a single-walled CNT 100, embedded particles 205/210 encapsulated within CNT 100, and voltage source 200 coupled (or otherwise operatively engaged with) CNT 100. More specifically, elements 205 and 210 generally represent the electron probability distributions for the encapsulated C60 molecules. When the switch is off, the electron probability distributions of the encapsulated particles 205/210 are in an OPEN position 115/120 rather than a CLOSED position 125/130, respectively. In the CLOSED position, a circuit would be engaged between voltage source 200, CNT 100, and encapsulated particles 205/210. In the OPEN position, a circuit would not be formed between voltage source 200, CNT 100, and encapsulated particles 205/210. Voltage source 200 is coupled to (or otherwise operatively engaged with) the outer surface of CNT 100 by way of conductive molecular chains 215/220. The double arrows generally depict the one-dimensional degree of freedom for the movement of the encapsulated particles between the starting positions 115/120 and the ending positions 125/130, respectively. Starting 115/120 and ending positions 125/130, respectively, generally correspond to configurations under energy conditions sufficient to induce tunneling oscillations to subsequently bring about movement of the at least partially conductive particles away from each other to disconnect a circuit.

Figure 3:
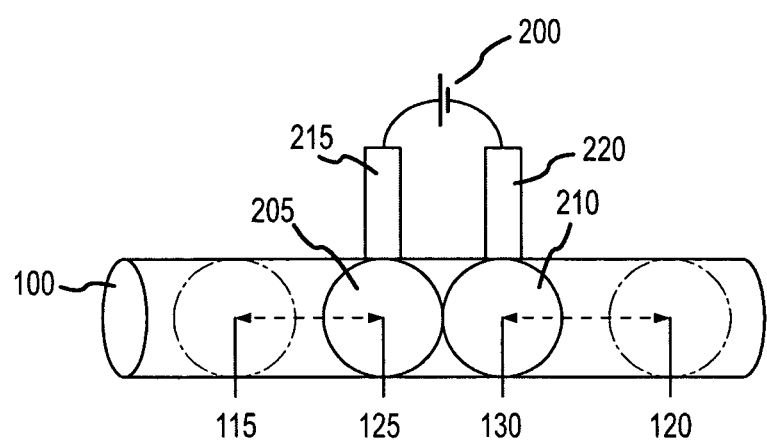
FIG. 3 representatively illustrates a nanotube switch with the particles' electron probability density distributions in an 'ON' configuration in accordance with an exemplary embodiment of the present invention.

As generally depicted in FIG. 3, a representative embodiment of the present invention provides a nanoswitch comprising a single-walled CNT 100, particles 205/210 encapsulated within the CNT 100 and voltage source 200 coupled to (or at least operatively engaged with) CNT 100. Encapsulated particles 205/210 are in a CLOSED position 125/130, respectively rather than an OPEN position 115/120. Voltage source 200 is coupled to (or at least operatively engaged with) the outer surface of CNT 100 by way of, for example, conductive molecular chains 215/220. The two-headed arrows generally indicate the one-dimensional degree of freedom for the motion of encapsulated particles between the OPEN position and the CLOSED position. The starting positions 115/120 and ending positions 125/130, respectively correspond to configurations under energy conditions sufficient to induce tunneling oscillations to subsequently bring about movement of the at least partially conductive particles toward each other to complete a circuit.

The system may experience symmetric oscillations (i.e., those isolations wherein the encapsulated particles generally move in opposite directions with respect to a point between the particles 205/210). Symmetric oscillations typically occur at frequencies up to about 520 GHz. The system may also experience non-symmetric oscillations (i.e., those isolations wherein the encapsulated particles generally move in the same direction with respect to a point between the particles 205/210). Non-symmetric oscillations typically occur at frequencies up to about 110 GHz.

The tunneling of electrons between two neighboring embedded particles 205/210 are generally more dominating than the direct overlap between the orbitals of the neighboring embedded particles. Generally, CNT 100 acts as a conduit that enhances the coupling between the neighboring embedded particles.

The low level of heat generation results in very little energy loss from the system. Accordingly, thermal management of devices and circuits employing CNT switches are greatly simplified.

In the foregoing specification, the invention has been described with reference to specific exemplary embodiments; however, it will be appreciated that various modifications and changes may be made without departing from the scope of the present invention as set forth in the claims below. The specification and Figures are to be regarded in an illustrative manner, rather than a restrictive one and all such modifications are intended to be included within the scope of the present invention. Accordingly, the scope of the invention should be determined by the claims appended hereto and their legal equivalents rather than by merely the examples described above.

For example, the steps recited in any method or process claims may be executed in any order and are not limited to the specific order presented in the claims. Additionally, the components and/or elements recited in any apparatus claims may be assembled or otherwise operationally configured in a variety of permutations to produce substantially the same result as the present invention and are accordingly not limited to the specific configuration recited in the claims.

Benefits, other advantages and solutions to problems have been described above with regard to particular embodiments; however, any benefit, advantage, solution to problem or any element that may cause any particular benefit, advantage or solution to occur or to become more pronounced are not to be construed as critical, required or essential features or components of any or all the claims.

As used herein, the terms "comprising", "having", "including", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

We claim:

1. A molecular-scale electronic switch device, said switch comprising:
   a carbon nanotube;
   an anode operatively connected to a first location on said carbon nanotube;
   a cathode operatively connected to a second location on said carbon nanotube; and
   at least two at least partially conductive particles encapsulated within said carbon nanotube, wherein the particles are configured to translate axially within said carbon nanotube such that, in a first state, the at least two particles are proximal to each other and provide electrical connectivity between the anode and the cathode.

2. The device of claim 1, wherein at least one of said encapsulated particles comprises at least one of Cobalt, Nickel, Cho, magnetic materials, semiconducting materials and ferromagnetic materials.

3. The device of claim 1, wherein the carbon nanotube comprises at least one of a single-walled nanotube, a double-walled nanotube and a multi-walled nanotube.

4. The device of claim 1, wherein at least one of said anode and said cathode are connected to the carbon nanotube via an at least partially conductive molecular chain.

5. The device of claim 4, wherein at least one of said anode and said cathode comprises an at least partially conductive molecular chain.

6. The device of claim 1, wherein said anode and said cathode are configured to induce movement of said particles into positions proximal to each other suitably disposed for conduction of electrons, wherein said movement of said particles is configured to proceed with the application of a voltage potential across said anode and cathode.

7. The device of claim 6, wherein the voltage potential is provides oscillatory actuation of said switch between at least one low resistance state and at least one high resistance state at a frequency of up to about 600 GHz.

8. The switch device of claim 1, wherein said carbon nanotube is at least one of metallic and semi-conducting.

9. A method for molecular-scale electronic switching, said method comprising the steps of:
- providing a carbon nanotube;
- providing an anode operatively connected to a first location on said carbon nanotube;
- providing a cathode operatively connected to a second location on said carbon nanotube;
- providing at least two at least partially conductive particles encapsulated within said carbon nanotube;
- moving the at least two partially conductive particles proximal to each other to provide electrical connectivity between the anode and the cathode; and
- moving the at least two partially conductive particles non-proximal to each other to remove electrical connectivity between the anode and the cathode.

10. The electronic switching method of claim 9, wherein said encapsulated particles are selected from the group consisting of Cobalt, Nickel, Cho, magnetic materials, semiconducting materials, ferromagnetic materials and combinations thereof.

11. The electronic switching method of claim 9, wherein the carbon nanotube comprises at least one of a single-walled nanotube, a double-walled nanotube and a multi-walled nanotube.

12. The electronic switching method of claim 9, wherein at least one of said anode and said cathode are connected to said carbon nanotube via an at least partially conductive molecular chain.

13. The electronic switching method of claim 12, wherein at least one of said anode and said cathode comprises an at least partially conductive molecular chain.

14. The electronic switching method of claim 9, wherein said anode and said cathode are suitably configured to induce movement of said particles into the positions proximal to each other disposed for conduction of electrons, wherein said movement of said particles is adapted to proceed with the application of a voltage potential across said anode and said cathode.

15. The electronic switching method of claim 14, wherein the voltage potential provides oscillatory actuation between at least one low resistance state and at least one high resistance state at a frequency of up to about 600 GHz.

16. The electronic switching method of claim 9, wherein said carbon nanotube is at least one of metallic and semiconducting.

* * * * *